United States Patent [19]

Zenitani et al.

[11] Patent Number: 5,404,275
[45] Date of Patent: Apr. 4, 1995

[54] RACK STRUCTURE FOR ACCOMMODATING ELECTRONIC MODULES

[75] Inventors: Hideki Zenitani; Sataroh Sawano; Mitsuo Ohkawachi, all of Kawasaki, Japan

[73] Assignee: Fujitsu Limited, Kawasaki, Japan

[21] Appl. No.: 10,986

[22] Filed: Jan. 29, 1993

[30] Foreign Application Priority Data

Jan. 30, 1992 [JP] Japan .................................. 4-014861

[51] Int. Cl.⁶ ........................................ H05K 7/14
[52] U.S. Cl. ........................... 361/802; 206/334;
361/731; 361/732; 361/741; 361/798; 361/801;
361/797; 439/59; 439/61; 439/64
[58] Field of Search ................ 206/328, 334, 387;
220/22; 211/41; 248/221.4, 223.3, 223.4, 224.1,
224.2, 243, 239; 312/8, 10, 320; 403/405.1;
361/601, 608, 609, 615, 614, 679, 724–732, 735,
740, 752, 754, 756, 796, 797, 798, 801, 802;
439/59, 61, 64, 928, 152-153, 155, 157, 160,
327, 328, 374, 376, 377

[56] References Cited

U.S. PATENT DOCUMENTS

| | | | |
|---|---|---|---|
| 4,380,360 | 4/1983 | Parmer et al. | 439/928 |
| 4,730,735 | 3/1988 | Lechmer | 211/41 |
| 4,858,070 | 8/1989 | Buron et al. | 439/928 |

OTHER PUBLICATIONS

Webster's Third New International Dictionary 1964 by "Philip Babcock Gove, Ph.D.".

*Primary Examiner*—Leo P. Picard
*Assistant Examiner*—Donald A. Sparks
*Attorney, Agent, or Firm*—Armstrong, Westerman, Hattori, McLeland & Naughton

[57] ABSTRACT

A rack comprises a plurality of lower guide rails arranged side by side to form the bottom thereof, and a plurality of upper guide rails arranged side by side to form the top thereo, for accommodating a plurality of electronic modules such as modems. Each of the modules includes a rectangular casing, lower and upper side edges of which are rounded or chamfered. The lower and upper guide rails are in vertical register with each other, respectively, and are vertically spaced from each other by a distance corresponding to a vertical height of the case. Each of the lower and upper guide rails has a pair of ridges coextended in parallel with each other and defining therebetween a guide path for complementarily and slidably receiving the corresponding side of the casing, whereby an outer width of the guide rails can be generally equal to a thickness of the casing due to the rounded or chamfered sides thereof. Also, a resilient detent element is provided in either of each lower guide rail or each upper guide rail to partially define an access opening formed therein for a person's finger to remove a module from the rack, and is engageable with the casing to lock the casing when it is accommodated in the rack. The detent element is resiliently deflected by putting a person's finger in the access opening, to thereby release a lock-engagement with the casing.

6 Claims, 5 Drawing Sheets

RACK STRUCTURE FOR ACCOMMODATING ELECTRONIC MODULES

BACKGROUND OF THE INVENTION

1) Field of the Invention

The present invention relates to a rack structure for accommodating a plurality of electronic modules such as modulator-demodulators (modems) or the like.

2) Description of the Related Art

In general, an electronic module such as a modem or the like includes a flat box-like casing, and a printed circuit board housed in the casing, and the module is provided with terminals to be electrically connected to signal wires. When equipment comprising a plurality of electronic modules is necessary, these modules are accommodated side by side in a rack as books are arranged on a bookshelf. In this case, the terminals of each electronic module are formed as a plug including terminal pins, and the plug is connected to an outlet or receptacle attached to a backboard of the rack. Whenever each of the modules is accommodated in the rack, the connection between the plug and the receptacle must be ensured. To this end, the modules are guided in to position in the rack.

In particular, the rack includes a plurality of lower guide rails arranged side by side to form the bottom of the rack, and a plurality of upper guide rails arranged side by side to form the top of the rack. The lower guide rails and the upper guide rails are in vertical register with each other, respectively, and are vertically spaced apart from each other by a distance corresponding to a vertical width or height of the flat box-like casing of the module. Each of the lower guide rails has a pair of ridge elements coextended in parallel with each other and spaced from each other by a distance corresponding to a thickness of the flat box-like casing of the module, so that the pair of ridge elements defines a guide path for slidably receiving the lower side of the flat box-like casing of the module. Similarly, each of the upper guide rails also has a pair of ridge elements coextended in parallel with each other and spaced from each other by a distance corresponding to a thickness of the flat box-like casing of the module, so that the pair of ridge elements defines a guide path for slidably receiving the upper side of the flat box-like casing of the module. The accommodation of the module in the rack is carried out by engaging rear ends of the lower and upper sides of the flat box-like casing thereof with a set of the registered lower and upper guide rails, and by pushing in and sliding the same along the lower and upper guide rails until the plug of the module is connected to the corresponding receptacle provided on the backboard of the rack.

Of course, each of the lower and upper guide rails has an outer width larger than a thickness of the flat box-like casing of the modules, i.e., a pitch of the modules accommodated in the rack is larger than the thickness of the flat box-like casing thereof. Accordingly, the pitch of the modules must be made samll enough so that as many of the modules as possible can be accommodated in the rack. Nevertheless, conventionally it is impossible to make the pitch of the modules smaller due to the geometry of the flat box-like casing of the module, as mentioned hereinbefore in detail.

On the other hand, when each of the modules is accommodated and positioned in place in the rack so that the plug is connected to the corresponding receptacle, the module should be locked to be prevented from being unintentionally removed from the rack. To this end, the lower or upper guide rail has a resilient detent element integrally formed therewith. When the module is positioned in place in the rack, the resilient detent element is engaged with a front or outer end of the flat box-like casing to thereby prevent the unintentional removal of the module from the rack. Conventionally, the detent element is arranged to interfere with the accommodation of the module in the rack. Accordingly, the detent element must be moved out of the way before the module can be accommodated in the rack. This means that a person has both hands full for the accommodation of the module in the rack. Namely, one hand is used to move the detent element out of the way, and the other hand is used to push in the module along the guide rails. Further, the person has both hands full for intentionally removing a module from the rack. Namely, one hand is used for disengagement of the detent element from the box-like casing, and the other hand is used to pull the module out of the rack. All things considered, with the conventional arrangement of the detent element, the accommodation of the module in the rack as well as the removal of the module therefrom are both troublesome in that both hands must be used.

SUMMARY OF THE INVENTION

Accordingly, an object of the present invention is to provide a rack structure for accommodating a plurality of electronic modules, wherein the electronic modules can be accommodated at a closer pitch.

Another object of the present invention is to provide a rack structure for accommodating a plurality of electronic modules, wherein accommodation of the electronic modules therein as well as removal of the electronic modules therefrom can be carried out by using only one hand.

In accordance with one aspect of the present invention, there is provided a rack structure for accommodating a plurality of electronic modules, each of the electronic modules including a rectangular casing, lower and upper side edges of which are rounded or chamfered, the rack structure comprising: a plurality of lower guide rails arranged side by side to form the bottom of the rack structure; and a plurality of upper guide rails arranged side by side to form the top of the rack structure, the lower guide rails and the upper guide rails being in vertical register with each other, respectively, and being vertically spaced from each other by a distance corresponding to the vertical height of the rectangular casing, wherein each of the lower guide rails has a pair of ridge elements coextended in parallel with each other and defining therebetween a guide path for complementarily and slidably receiving the rounded or chamfered lower side of the rectangular casing, and each of the upper guide rails has a pair of ridge elements coextended in parallel with each other and defining therebetween a guide path for complementarily and slidably receiving the rounded or chamfered upper side of the rectangular casing, whereby an outer width of the lower and upper guide rails can be generally equal to a thickness of the rectangular casing due to the rounded or chamfered lower and upper sides thereof. The lower and upper side faces of the rectangular casing may be laterally slanted to converge toward each other, and the ridge elements of the lower and upper guide rails are constituted to complementarily receive the slanted lower and upper side faces of the rectangular casing, respectively.

According to another aspect of the present invention, there is provided a rack structure for accommodating a plurality of electronic modules, each of the electronic modules including a rectangular casing, lower and upper side edges of which are rounded or chamfered, the rack structure comprising: a plurality of lower guide rails arranged side by side to form the bottom of the rack structure, each of the lower guide rails having an access opening for a person's finger formed at the front end thereof; a plurality of upper guide rails arranged side by side to form the top of the rack structure, each of the upper guide rails having an access opening for a person's finger formed at the front end thereof, the lower guide rails and the upper guide rails being in vertical register with each other, respectively, and being vertically spaced from each other by a distance corresponding to a vertical height of the rectangular casing; and a resilient detent element provided in either of each lower guide rail or each upper guide rail to partially define the access opening formed therein, the detent element being engageable with the rectangular casing to lock the same when accommodated in the rack structure, wherein the detent element is resiliently deflected by putting a person's finger in the access opening, to thereby release a lock-engagement with the rectangular casing. The rectangular casing may have a wedge element attached thereto, which is engageable with the detent element.

BRIEF DESCRIPTION OF THE DRAWINGS

Other objects and advantages of the present invention will be better understood from the following description, with reference to the accompanying drawings, in which.

DESCRIPTION OF THE PREFERRED EMBODIMENTS

Figure 1:
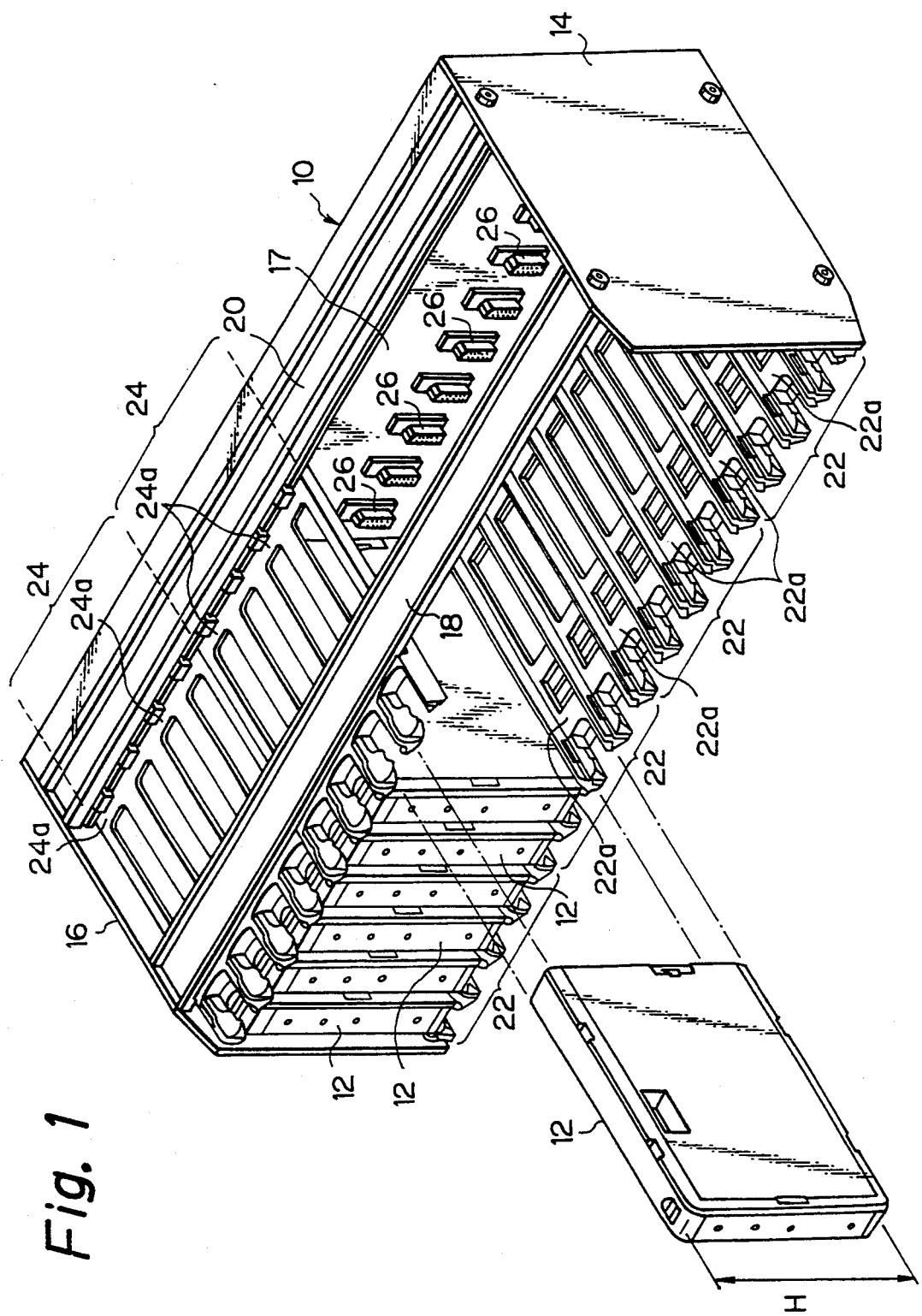
FIG. 1 is a perspective view of a rack structure according to the present invention.

FIG. 1 perspectively shows a rack 10, and eight electronic modules 12 such as modulator-demodulators (modems) or the like, seven of which are accommodated in the rack 10, and the remaining one of which is shown outside of the rack 10.

The rack 10 comprises side walls 14 and 16, a backboard 17 extended between rear side edges of the side walls 14 and 16, a pair of upper cross beams 18 and 20 extended between upper side edges of the side walls 14 and 16, and a pair of lower cross beams (not visible) extended between lower side edges of the side walls 14 and 16. These elements may be formed of a suitable metal such as aluminum, steel or the like. As shown in FIG. 1, the rack 10 also comprises four lower guide rail units 22 attached to the not visible cross beams and arranged side by side to form the bottom of the rack 10. Each of the lower guide rail units 22 includes four guide rails 22a, and is integrally made of a suitable resin material. Namely, in this embodiment, the bottom of the rack 10 is constituted by sixteen lower guide rails 22a. Similarly, the top of the rack 10 is formed by four upper guide rail units 24 attached to the upper cross beams 18 and 20, but two of the units 24 are omitted from FIG. 1 for the sake of convenience. Each of the upper guide rail units 24 also includes four guide rails 24a, and may be integrally molded from a suitable resin material, preferably the same material as the lower guide unit 22.

Figure 2:
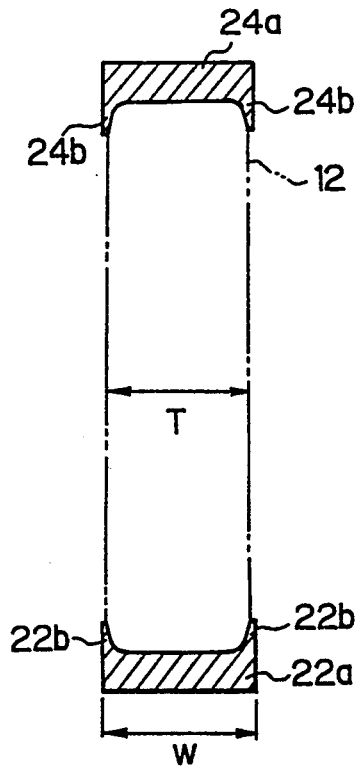
FIG. 2 is a cross-sectional view of a set of vertically registered lower and upper guide rails arranged in the rack structure of FIG. 1.

As apparent from FIG. 1, each of the electric modules 12 comprises a rectangular or flat box-like casing in which a printed circuit board is housed. Note, preferably, the flat box-like casing is integrally molded from a suitable resin material. The lower guide rails 22a and the upper guide rails 24a are in vertical register with each other, respectively, and are vertically spaced from each other by a distance corresponding to a vertical width or height H of the casing of the module 12. As best shown in FIG. 2, according to an aspect of the present invention, lower side edges of the flat box-like casing are rounded or chamfered, and the lower guide rail 22a has a pair of ridge elements 22b, 22b coextended in parallel with each other and defining a guide path therebetween for complementarily and slidably receiving the rounded or chamfered lower side of the casing. Similarly, upper side edges of the casing of the module 12 are also rounded or chamfered, and the upper guide rail 24a has a pair of ridge elements 24b, 24b coextended in parallel with each other and defining a guide path therebetween for complementally and slidably receiving the rounded or chamfered upper side of the flat box-like casing. Accordingly, the accommodation of each module 12 in the rack 10 can be carried out by engaging rear ends of the lower and upper sides of the casing thereof with a set of the registered lower and upper guide rails 22a and 24a, and by pushing in and sliding the same therealong. Note, in FIG. 1, reference numeral 26 indicates outlets or receptacles attached to the backboard 17 of the rack 10, and each receptacle 17 is connected to a plug (not visible) provided at the rear side of the corresponding module 12 when accommodated in the rack 10.

Figure 3:
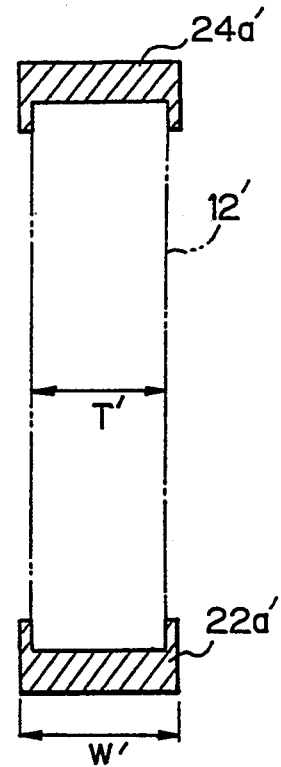
FIG. 3 is a cross-sectional view corresponding to FIG. 2, showing a set of a vertically registered lower and upper guide rails of a conventional type rack structure.

As apparent from FIG. 2, an outer width w of the lower and upper guide rails 22a and 24a can be generally equal to a thickness T of the flat box-like casing due to the rounded and chamfered lower and upper sides thereof. On the other hand, in FIG. 3, a conventional type flat box-like casing for an electronic module 12' is shown by a phantom line, and lower and upper sides thereof are not rounded or chamfered. In this case, an outer width w' of a lower guide rail 22a' and an upper guide rail 24a' is remarkably larger than a thickness T' of the conventional casing. Thus, according to the present invention, it is possible to arrange the lower and upper guide rails 22a and 24a at a closer pitch in the rack 10. Namely, more modules can be accommodated in the rack in comparison with the conventional case.

Figure 4:
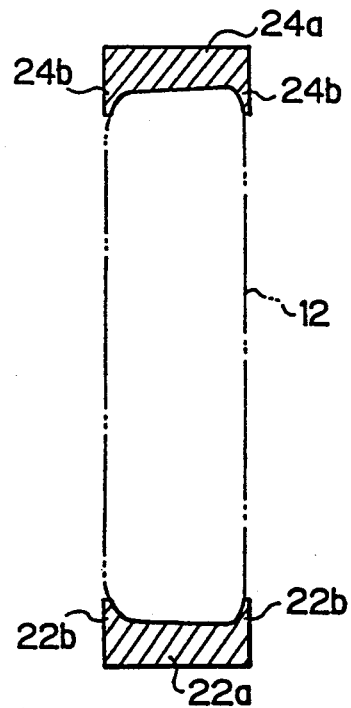
FIG. 4 is a cross-sectional view similar to FIG. 2, showing a modification thereof.
Figure 5:
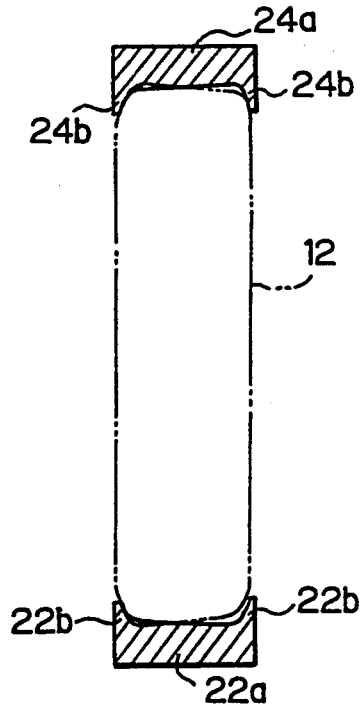
FIG. 5 is a cross-sectional view similar to FIG. 4, but with a flat box-like casing of the electronic module shown by a phantom line being reversely oriented.

FIG. 4 shows a modification of the embodiment shown in FIGS. 1 and 2. As apparent from this drawing, In this modified embodiment, the lower and upper side faces of the flat box-like casing of the module 12 are laterally slanted to converge toward each other, and the ridge elements 22b; 22b, and 24b; 24b of the lower and upper guide rails 22a and 24a are constituted to complementarily receive the slanted lower and upper side faces of the casing, respectively. When this type casing is integrally molded from a suitable resin material, it can be easily released from a mold. Also, the flat box-like casing having the slanted lower and upper side faces cannot be reversely accommodated in the rack 10, as shown in FIG. 5. Namely, an unintentional reverse accommodation of the module 12 in the rack 10 can be effectively prevented.

Figure 6:
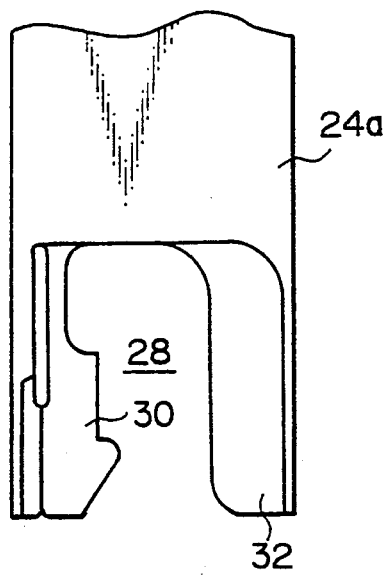
FIG. 6 is a partial plan view showing a front end portion of the upper guide rail.
Figure 7:
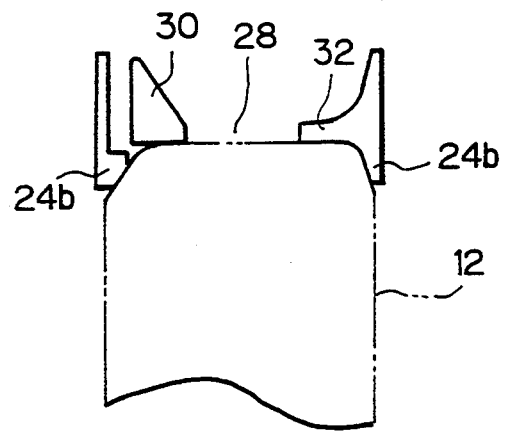
FIG. 7 is a front view of FIG. 6.
Figure 8:
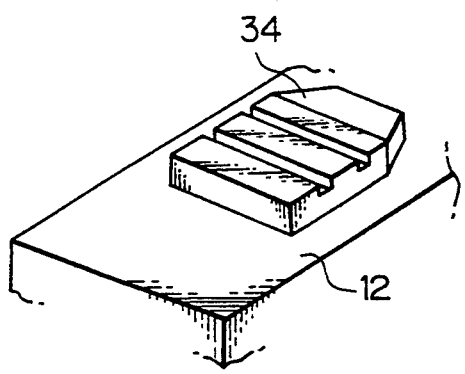
FIG. 8 is a partial perspective view of the flat box-like casing.
Figure 9:
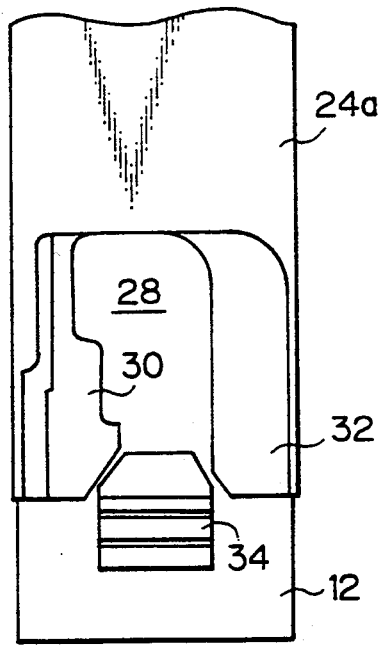
FIG. 9 is a partial plan view showing a front end portion of the upper guide rail, in which a wedge element attached to the flat box-like casing is just engaged with a resilient detent element provided in the upper guide rail.
Figure 10:
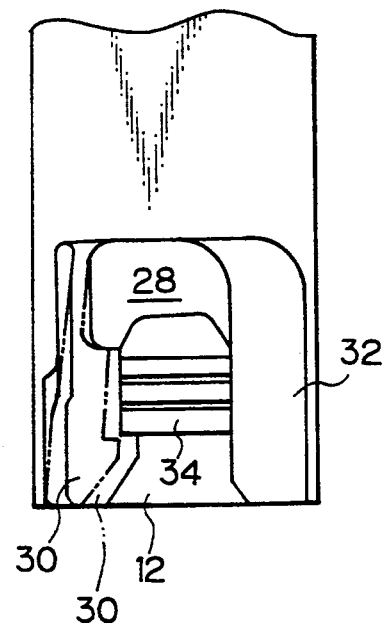
FIG. 10 is a partial plan view similar to FIG. 9, in which the wedge element is locked by the detent element.

According to a second aspect of the present invention, each of the upper guide rails 24a has an opening 28 formed at a front end thereof, as shown in FIGS. 6 and 7, and this opening 28 is partly defined by a resilient detent element 30 integrally formed with the upper guide rail 24a and extended along one of the ridge elements 24b and by a tongue-like element 32 integrally and horizontally projected from the other ridge element 24b. Note, each of the lower guide rails 22a also has an opening formed at a front end thereof, but, in this embodiment, no detent element is provided therein. On the other hand, each of the modules 12 is provided with a wedge element 34 securely mounted on the upper side of the flat box-like casing adjacent to the front end thereof, as shown in FIG. 8. As mentioned above, when the module 12 is accommodated in the rack 10, it is pushed in along the vertically registered lower and upper guide rails 22a and 24a. Just before the plug of the module 12 is connected to the corresponding receptacle 26 (FIG. 1), the wedge element 34 is engaged with the detent element 34, as shown in FIG. 9. Then, the detent element 34 is resiliently deflected, as shown by a phantom line in FIG. 10. When the connection between the plug and the receptacle 26 is completed, the wedge element 34 clears a hook-like portion of the detent element 34, and is then locked thereby, as shown by a solid line in FIG. 10. Accordingly, it is possible to carry out the accommodation of the module 12 in the rack 10 by only one hand.

Figure 11:
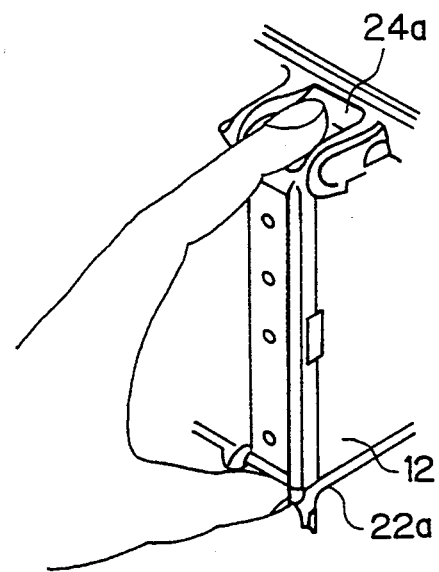
FIG. 11 is a partial perspective view showing a front side of the rack structure, in which the bulbs of the thumb and forefinger are put in access openings formed at the front ends of the lower and upper guide rails for removal of the flat box-like casing from the rack structure.
Figure 12:
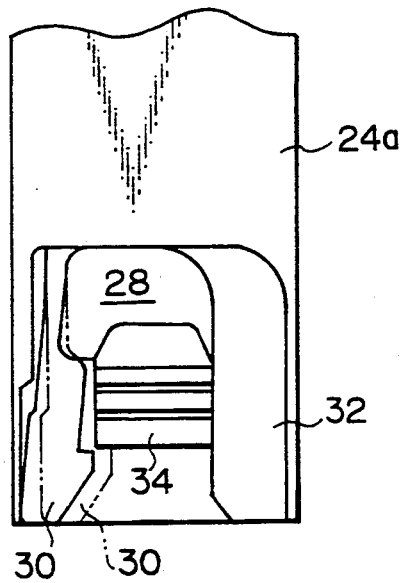
FIG. 12 is a partial plan view similar to FIG. 10, in which the detent element is resiliently deflected.
Figure 13:
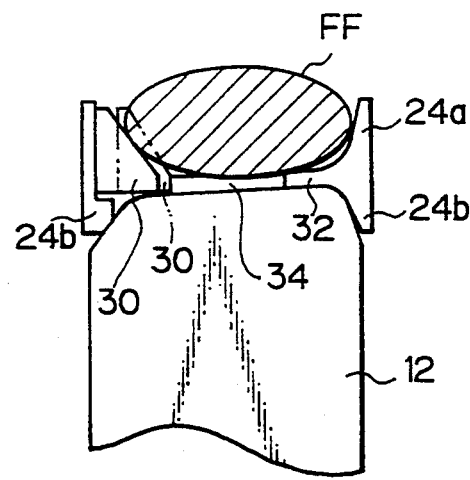
FIG. 13 is a front view of FIG. 12.

When each of the modules 12 is removed from the rack 10, the front end openings of the lower and upper guide rails 22a and 24a serve as an access opening for fingers of one hand. In particular, for example, the removal of the module 12 from the rack 10 is carried out by putting the pads of the thumb and forefinger in the access openings of the lower and upper guide rails 22a and 24a, respectively, as shown in FIG. 11. When the pad of the forefinger is put in the access opening 24a, the detent element 30 is resiliently deflected, as shown in FIGS. 12 and 13. Namely, the detent element 30 is resiliently moved from a lock position in which the detent element 30 is shown by a phantom line, to a release position in which the detent element 30 is shown by a solid line. Thus, the module 12 can be pulled out of the rack 10 by the thumb and forefinger of one hand. Note, in FIG. 13, a forefinger put in the access opening 24a is indicated by reference FF.

It will be understood by those skilled in the art that the foregoing description is of preferred embodiments of the present invention, and that various changes and modifications can be made without departing from the spirit and scope thereof. For example, the detent element may be provided in not the upper guide rail but the lower guide rail.

We claim:

1. A rack and module structure, comprising:
   at least one electronic module having a rectangular casing with lower and upper side edges which are chamfered; and
   a rack structure including:
   a plurality of lower guide rails arranged side by side to form a top of the rack structure, said lower guide rails and said upper guide rails being in vertical register with each other, respectively, and being vertically spaced from each other by a distance corresponding to a vertical height of said rectangular casing,
   wherein each of said lower guide rails has a pair of ridge elements coextended in parallel with each other and defining therebetween a chamfered guide path complementarily slidably receiving the chamfered lower side edges of the rectangular casing, and each of said upper guide rails has a pair of ridge elements coextended in parallel with each other and defining therebetween a chamfered guide path complementarily slidably receiving the chamfered upper side edges of the rectangular casing,
   wherein an outer width of said lower and upper guide rails is generally equal to a thickness of said rectangular casing due to the chamfered lower and upper side edges thereof; and
   wherein the lower and upper side faces of said rectangular casing are laterally slanted to converge toward each other, and the ridge elements of said lower and upper guide rails are constituted to complementarily receive the slanted lower and upper side faces of said rectangular casing, respectively.

2. A rack and module structure, comprising:
   at least one electronic module having a rectangular casing; and
   a rack structure including:
   a plurality of lower guide rails arranged side by side to form a bottom of the rack structure, each of said lower guide rails having an access opening for a person's finger formed at a front end thereof;
   a plurality of upper guide rails arranged side by side to form a top of the rack structure, each of said upper guide rails having an access opening for a person's finger formed at a front end thereof, said lower guide rails and said upper guide rails being in vertical register with each other, respectively, and being vertically spaced from each other by a distance corresponding to a vertical height of said rectangular casing; and a resilient detent element provided in either of each lower guide rail or each upper guide rail to partially define the access opening formed therein, said detent element being engageable with said rectangular casing to lock the same when accommodated in said rack structure, wherein said detent element is resiliently deflected by putting a person's finger in the access opening, to thereby release a lock-engagement with said rectangular casing.

3. A rack and module structure as set forth in claim 2, wherein said rectangular casing has a wedge element attached thereto, which is engageable to said detent element.

4. A rack structure as set forth in claim 2, wherein lower and upper side edges of said rectangular casing are chamfered, and each of said lower guide rails has a pair of ridge elements coextended in parallel with each other and defining therebetween a chamfered guide path complementarily slidably receiving the chamfered lower side edges of the rectangular casing, and each of said upper guide rails has a pair of ridge elements coextended in parallel with each other and defining therebetween a chamfered guide path complementarily slidably receiving the chamfered upper side edges of the rectangular casing, whereby an outer width of said lower and upper guide rails is enabled to be generally equal to a thickness of said rectangular casing due to the chamfered lower and upper side edges thereof.

5. A rack structure as set forth in claim 4, wherein the lower and upper side faces of said rectangular casing are laterally slanted to converge toward each other, and the ridge elements of said lower and upper guide rails are constituted to complementarily receive the slanted lower and upper side faces of said rectangular casing, respectively.

6. A rack structure for accommodating a plurality of electronic modules having a rectangular casing, said rack structure comprising:

a plurality of lower guide rails arranged side by side to form a bottom of the rack structure, each of said lower guide rails having an access opening for a person's finger formed at a front end thereof;

a plurality of upper guide rails arranged side by side to form a top of the rack structure, each of said upper guide rails having an access opening for a person's finger formed at a front end thereof, said lower guide rails and said upper guide rails being in vertical register with each other, respectively, and being vertically spaced from each other by a distance corresponding to a vertical height of said rectangular casing; and a resilient detent element provided in either of each lower guide rail or each upper guide rail to partially define the access opening formed therein, said detent element being engageable with said rectangular casing to lock the same when accommodated in said rack structure, wherein said detent element is resiliently deflected by putting a person's finger in the access opening, to thereby release a lock-engagement with said rectangular casing.

* * * * *